US006725187B1

(12) United States Patent
Cheng et al.

(10) Patent No.: US 6,725,187 B1
(45) Date of Patent: *Apr. 20, 2004

(54) LATCH INFERENCE USING DATAFLOW ANALYSIS

(75) Inventors: Szu-Tsung Cheng, Campbell, CA (US); Alexander Saldanha, El Cerrito, CA (US); Patrick C. McGeer, Orinda, CA (US); Patrick Scaglia, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 551 days.

This patent is subject to a terminal disclaimer.

(21) Appl. No.: 09/592,125

(22) Filed: Jun. 12, 2000

Related U.S. Application Data

(63) Continuation of application No. 09/215,645, filed on Dec. 16, 1998, now Pat. No. 6,077,305.

(51) Int. Cl.$^7$ .............................................. G06F 17/50
(52) U.S. Cl. ................................ 703/16; 716/1; 716/3; 716/18
(58) Field of Search ................................ 703/16; 716/1, 716/3, 18

(56) References Cited

U.S. PATENT DOCUMENTS

| | | | |
|---|---|---|---|
| 5,491,640 A | | 2/1996 | Sharma et al. |
| 5,530,841 A | | 6/1996 | Gregory et al. |
| 5,748,488 A | | 5/1998 | Gregory et al. |
| 5,752,000 A | | 5/1998 | McGeer et al. |
| 5,764,951 A | | 6/1998 | Ly et al. |
| 5,774,370 A | | 6/1998 | Giomi |
| 6,077,305 A | * | 6/2000 | Cheng et al. ................. 703/16 |

OTHER PUBLICATIONS

Bolchini et al.,"Software Methodologies in VHDL Code Analysis" Journal of Systems Architecture, Oct., 1997, vol. 44, pp. 3–21.
Szu–Tsung Cheng, et al., "Compiling Verilog Into Automata," Memorandum UCB/ERL M94/37, University of California at Berkeley, 1994.
Ellen M. Sentovich et al., "Sequential Circuit Design Using Synthesis and Optimization," in proceedings of IEEE ICCD, Cambridge, MA, Oct. 11–14, 1992, pp. 328–333.
A. Aziz et al., "HSIS: A BDD–Based Environment for Formal Verification," 31st Design Automation Conference, San Diego, CA, Jun. 6–10, 1994, pp. 454–459.
Szu–Tsung Cheng et al., "Compiling Verilog into Timed Finite State Machines," 1995 IEEE International Verilog HDL Conference, Santa Clara, CA, MAr. 27–29, 1995, pp. 32–39.
Jean G. Vaucher et al., "A Comparison of Simulation Event List Algorithms," Communications of the ACM, Apr. 1975, vol. 18, No. 4, pp. 223–230.
Ernst G. Ulrich, "Event Manipulation for Discrete Simulations Requiring Large Numbers of Events," Communications of the ACM, Sep. 1978, vol. 21, No. 9, pp. 777–785.

* cited by examiner

Primary Examiner—Russell Frejd
(74) Attorney, Agent, or Firm—John Carpenter; Reed Smith LLP

(57) ABSTRACT

A system and method are provided for selectively inferring latch elements in a circuit design from an event-driven hardware description language (HDL) file to an event-independent format. The method includes modeling the file as a plurality of data flow equations, analyzing the plurality of equations for uninitialized variables, and placing a latch at any utilized, uninitialized variable. Control signal information for an inferred latch is also derived during the data flow analysis.

9 Claims, 2 Drawing Sheets

$out[S] = gen[S] + (in[S] - kill[S])$
FIG. 1
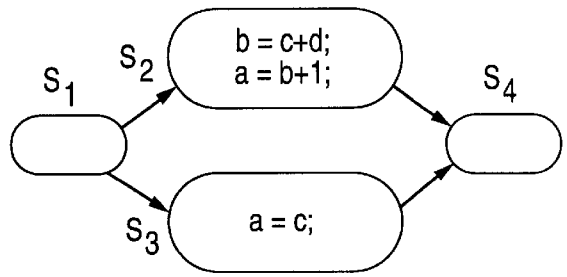
FIG. 2
```
if (cond)   a = b;
if (!cond)  a = c;
<stmt>
```
FIG. 3
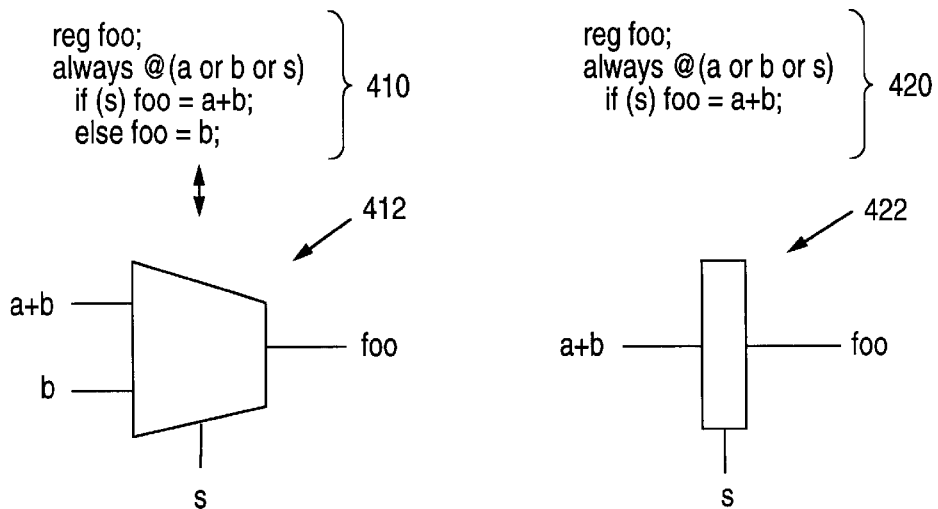
FIG. 4

LATCH INFERENCE USING DATAFLOW ANALYSIS

This is a continuation of Ser. No. 09/215,645, Dec. 16, 1998 now U.S. Pat. No. 6,077,305.

FIELD OF THE INVENTION

The invention relates generally to the field of electronic design automation (EDA), and particularly to a system and method for improving the speed and accuracy of latch inference in EDA.

BACKGROUND OF THE INVENTION

Discrete function simulation is one of the core tasks in rapid system prototyping and debugging in EDA. Improvements in discrete function simulation time can dramatically improve system design time. Discrete function simulators address the problem of finding the values of circuit outputs, given a circuit design and a vector of circuit input values. One example of a discrete function simulator is a logic simulator.

Until recently, conventional logic simulators in the EDA environment operated in an event-driven manner, wherein a plurality of wires connect a plurality of logic elements within a circuit-under-test. As input vectors cascade through the logic elements the logical value (1 or 0) of each wire may change. Each change in the value of a wire is regarded as an event. A memory queue stores the events. When the logical value of a wire changes, each gate having the modified wire as an input is subsequently tested to determine whether the logical value on the output wire of the gate has changed. A change in the value on this output wire is a new event which is placed in the memory queue. This process continues until all of the gates within the circuit-under-test have been processed.

The performance of such conventional logic simulators is therefore dependent upon the number of gates in the simulated circuit and is limited by the size and speed of the memory queue. Hundreds of thousands or even millions of gates may be present on a single integrated circuit (IC), e.g., an application specific integrated circuit (ASIC) or circuit implemented on a programmable or reprogrammable logic device. Simulating all of the gates and events occurring on such an IC requires a significant amount of time and computer resources.

To address the need for a more efficient logic simulator which functions in a manner independent of the number of gates in a circuit and the number of events occurring in a system, McGeer, et al. invented and patented an event-independent SYSTEM AND METHOD FOR SIMULATING DISCRETE FUNCTIONS USING ORDERED DECISION ARRAYS, disclosed and claimed in U.S. Pat. No. 5,752,000 (which is incorporated herein by reference), filed Aug. 2, 1994, issued May 12, 1998, and owned by Cadence Design Systems, Inc., the assignee of the present invention.

The reader will benefit at this point in the background discussion from a brief history of logic design. When the now-ubiquitous hardware design tools Verilog and VHDL were first introduced, no single logic synthesis methodology was in widespread use and the only common verification technology was event-driven simulation. Since that time, however, logic synthesis (the automated optimization of a digital circuit for die area, speed, or power) has become a ubiquitous tool among digital designers. Further, a welter of modern verification tools have been added to the circuit designer's desktop: timing analysis (which determines the speed of a digital circuit); formal verification (in which the correctness of the design is proven mathematically); and more efficient forms of simulation ("cycle" simulation) in which only a small proportion of the actual assignments of the circuit are performed, and thus much greater speed is gained.

All of these latter-day tools operate not on the HDL description of the circuit, but on the circuit itself. However, for a variety of reasons, Verilog and VHDL continue to dictate the input format to all circuit verification tools including synthesis tools (which optimize circuit structure for size, complexity, speed, or consumed power), timing analysis tools (which determine how long a circuit takes to perform its function), and formal verification tools (which formally and completely prove circuit properties). The need, therefore, to rapidly, efficiently, and accurately divine the underlying circuit from an HDL description of a circuit becomes paramount.

Unfortunately, HDLs have their basic semantics strongly rooted in their event-driven simulation origins. In particular, in event-driven simulation, each variable is tied to a memory location: each assignment to the variable is stored in the memory location, and remains the value of the variable until the variable is freshly assigned. In the underlying circuit, this specific behavior can only be realized by attaching a memory circuit to each variable—known in the art to which the present invention pertains as a "latch". However, such latches are both expensive in circuit area and introduce a one-cycle delay to each assignment. For this reason, only about 5–10% of variables in a typical circuit are latched in this manner.

The major problem in finding the underlying circuit from a description in an HDL file is to determine which small set of the variables in the HDL file should be so "latched". The method must be fast and efficient in all cases, since circuits are often very large, and embody a rule so simple and easy to understand that a competent circuit designer can easily determine which variables in his program will be latched in the realized circuit. This last element is particularly crucial: determination of which signals in a circuit are latched is of great importance in circuit design, and thus must be controlled by the designer.

Thus, while event-independent simulation (often referred to in the industry as fast function evaluation or cycle simulation) has proven advantages, the change has brought severe complications. A cycle simulator cannot seamlessly replace event-driven simulators intended for use with behavioral languages such as Verilog and VHDL. The semantics of event-driven simulation languages find their foundation in the event queue, and so removal of the queue makes simulation difficult. Thus, cycle simulators are based upon a precisely defined, cycle simulating HDL, which comprises a set of state variables and combinational logic. In cycle simulating HDL, combinational logic re-evaluates its output in zero time (clock-independent) in response to an input change, and therefore functions in a manner independent of an event queue.

Put simply, latch inference is the process of determining whether a given design variable is sequential (necessitating a latch-type memory bit) or combinational (no memory needed).

One available approach, provided in the Design Compiler® software tool sold by Synopsis, Inc., comprises tautology checking, wherein every possible value of a given variable is analyzed, and when any unassigned circumstance is encountered, a latch or more complex sequential element is assigned. However, this tautological method involves a global analysis of the whole design, an exhaustive computation which consumes considerable and costly computational resources, making it impractical for a designer to precisely determine which signals are latched. This system is described and claimed in U.S. Pat. No. 5,530,841 to Gregory, et al., incorporated herein by reference. Thus, Gregory, et. al attach a logic expression to each assignment of a variable, and then determine whether the disjunction of these logic expressions is tautologous. It is therefore assumed in the Gregory approach that fewer latches are better, i.e., that the challenge is one of simple optimization with a simple objective function. This approach is flawed in both the simplicity of its conception and complexity of its execution.

SUMMARY OF THE INVENTION

Since tautology checking is an exhaustive and computationally intensive process (i.e., NP-complete), there remains a need in the art for a more refined yet thorough approach to latch inference. More particularly, a fundamental problem in latch inference is determining whether or not a variable is always directly assigned. If it is, then it is assumed that the variable has no need of storage, since its value is determined independent of any stored value. If not, then it is assumed that the stored value is desired where the variable is not directly assigned.

Once the basic challenge is established, the derived problem is that a specific variable is often assigned in different branches of a program: the problems becomes determining whether the program in execution always traverses at least one of the branches under which a specific variable is assigned, or whether there are cases when the program doesn't traverse such a branch.

The present invention provides a method and apparatus to meet this need in the art without compromising function or efficiency. Data-flow analysis is utilized to provide an efficient means of determining the variables assigned in each program branch. In this analysis, the individual statements in a program are simplified to a data-flow equation in four variables:

$$\text{out}[S]=\text{in}[S]+(\text{gen}[S]-\text{kill}[S])$$

where out[S] comprises the variables unassigned after statement S is executed, in[S] comprises the variables unassigned before statement S is executed, gen[S] comprises the new variables assigned in statement S, and kill[S] comprises the variables assigned in all branches of statement S. Thus, in[S] and gen[S] are easily defined, while kill[S] is a statement type-specific function, with a different equation for each statement type in a language. For example, given the if statement "S: if (cond) S1; else S", then kill[S] comprises the intersection of kill[S1] and kill[S2].

Put more precisely, to address the shortcomings of the prior art, the present invention provides a system and method for inferring latch elements in a circuit design from a hardware description language (HDL) file using data flow analysis, the method comprising the steps of identifying and recording a set of variables $L_p$ used in the expression, for a variable within the set $L_p$, conducting an uninitialized variable analysis for a given input signal, and if the variable is accessed while uninitialized, inferring a latch for that variable.

In one aspect, the method further comprises, if an uninitialized variable is not accessed, inferring a wire.

In another aspect, the method further comprises determining conditions under which the variable is modified, and from the determined conditions inferring a clocking signal for the inferred latch.

In still another aspect, the method of the present invention comprises modeling an HDL file as a plurality of data flow equations, analyzing the plurality of equations for a uninitialized variable, and placing a latch at an uninitialized variable.

In yet another aspect, the method of the present invention further comprises analyzing the plurality of equations for a utilized, uninitialized variable.

In still another aspect, the method of the present invention comprises analyzing an HDL file for variables, for each variable, performing an uninitialized variable analysis, and for each uninitialized variable accessed inferring a latch having a selected control signal.

It is therefore a first advantage of the present invention to provide a latch inference system for circuit simulation and synthesis which utilizes data flow analysis.

It is a second advantage of the present invention to provide a latch inference system for circuit simulation and synthesis which utilizes uninitialized variable analysis.

A system for implementing the method embodiments of the present invention is also disclosed and claimed herein.

BRIEF DESCRIPTION OF THE DRAWING

The aforementioned advantages of the present invention as well as additional advantages thereof will be more clearly understood hereinafter as a result of a detailed description of the embodiments of the invention, taken in conjunction with the following drawings in which:

FIG. 1 illustrates a data flow equation.

FIG. 2 illustrates an uninitialized data flow analysis as incorporated in the method and system of the present invention.

FIG. 3 illustrates a series of equations in an HDL file, for analysis using the system and method of the present invention.

FIG. 4 provides an example of the latch inference system and method of the present invention.

DETAILED DESCRIPTION OF PREFERRED EMBODIMENTS

Figure 5:
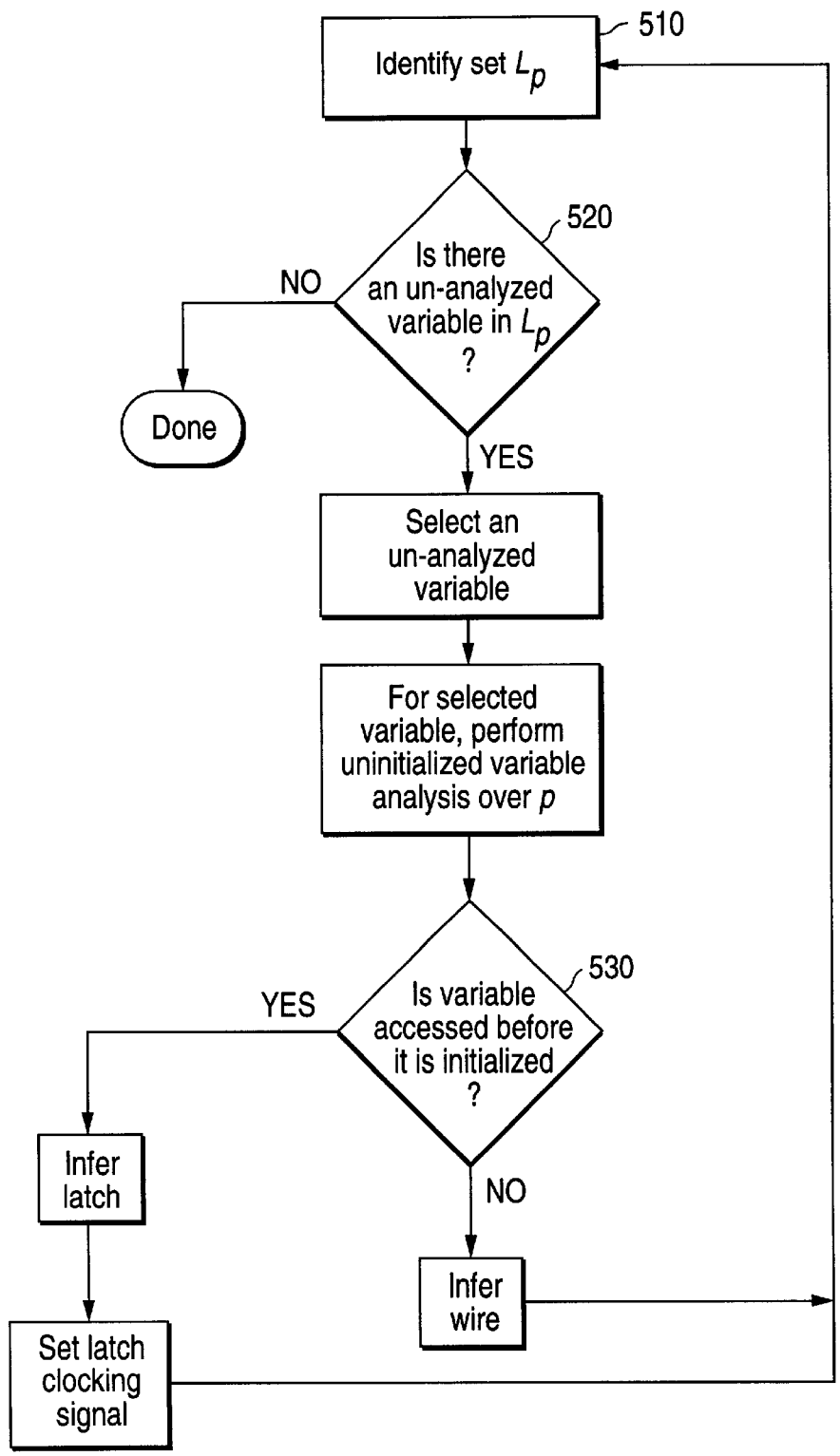
FIG. 5 is a flowchart illustrating the method and system of the present invention.

Referring first to FIG. 1, data flow analysis provides a perspective on circuit design necessary for the latch inference method and system of the present invention. Data flow analysis is a set of techniques for collecting information regarding how data values are modified and accessed across basic circuit blocks (wherein a basic block is a linear sequence of simple statements free of pauses and branches except at the end). Data flow information is collected by setting up and solving a system of data-flow equations of the form shown in FIG. 1, which can be read as, "the information available at the end of a statement S (out[S]) equals the information generated in S (gen[S]) plus the information available at the beginning of S (in[S]) excluding the information killed in S (kill[S])."

Referring next to FIG. 2, we find an example of data flow analysis leading to latch inference. We assume that out[$S_1$]={a,b,c} (after $S_1$ is executed, {a,b,c} can potentially be uninitialized). Since gen[$S_2$]={a,b} (a and b are assigned in statement $S_2$), and in[$S_2$]={a,b,c} (as derived from out[$S_1$]), and kill[$S_2$]=∅ (an empty set), we know that out[$S_2$]={c}. Similarly, we know out[$S_3$]={b,c}. Therefore, in[$S_4$]={b,c}

(that is, the sum of $S_2$ and $S_3$). Thus, if after statement $S_1$ is executed {a,b,c} are uninitialized, then at the beginning of $S_4$, {b,c} may still by uninitialized and an asynchronous element is inferred.

Referring next to FIG. 3, there is illustrated an example of the data-flow method of the present invention which exemplifies the conservative nature of the method and system of the present invention, providing at least as many latches as had been intended by the HDL programmer, while still providing an efficient method of inferring latches on a large scale without utilizing the tautological approach of the available art. By applying the uninitialized variable analysis method of the present invention to the equations of FIG. 3, assuming variable "a" is uninitialized before conditional statements are encountered, then in[<stmnt>]={a, . . . }. Thus, the method and system of the present invention works under an assumption that a data flow wherein all conditional expressions become false is possible, even though, in reality, such a path could never be taken. While this characteristic of the method and system of the present invention is worth noting, it is not a critical element of the invention and the claims appended hereto should not be read to include such an element, unless specific language therein provides for such a reading.

Referring next to FIG. 4, a second example of the latch inference method and system of the present invention is illustrated. To determine whether a variable is sequential (and therefore whether a latch should be inferred for that variable), it is determined whether a variable may be read without being explicitly assigned. If so, then the variable must be able to "remember" its value in the previous clock cycle, and a latch is allocated. In FIG. 4, expression 410 indicates a wire 412 (a multiplexer output line), since all possible values of variable "foo" are indicated. In contrast, expression 420 implies that "foo" is a latch 422, since the conditional statement may be false with no value provided.

To search for sequential variables, as found in expression 420, an uninitialized variable analysis is conducted using the method and system of the present invention, as illustrated in FIG. 5. First, all variables used in the expression along path p are recorded at step 510 (as the set $L_p$). Next, for each variable (a∈$L_p$) an uninitialized variable analysis is conducted for a given input (over p with in[p] set to {a}), at step 520. At step 530, if the variable is accessed before it is removed from the set of uninitialized variables (if a∈out[p] or a is accessed inside p before it is removed from $L_p$) then the variable is sequential and a latch is inferred. Otherwise, a wire is inferred. This process also provides the clocking signal for the inferred latch, since the conditions under which a is modified are used as the clocking signal.

Although the present invention has been shown and described with respect to preferred embodiments, various changes and modifications are deemed to lie within the spirit and scope of the invention as claimed. Moreover, It should be understood that the invention may be implemented through alternative embodiments within the spirit of the present invention. For example, the method and system of the present invention may be used for latch inference outside the context of translating from an event-based simulator to a cyclic simulator. Similarly, any corresponding structures, materials, acts, and equivalents of all means or step plus function elements in the claims which follow are intended to include any structure, material, or acts for performing the functions in combination with other claimed elements as specifically claimed.

What is claimed is:

1. A method of determining whether a latch is represented in an expression of a circuit using data flow analysis, the method comprising the steps of:

identifying a set of variables $L_p$ used in the expression;

for a variable within the set $L_p$, conducting an uninitialized variable analysis for a given input signal;

if the variable is accessed while uninitialized, inferring a latch for that variable.

2. The method of claim 1, further comprising the step of inferring a wire if an uninitialized variable is not accessed.

3. The method of claim 1, further comprising the step of determining the conditions under which the variable is modified, and from the conditions inferring a clocking signal for the inferred latch.

4. A system for determining whether a latch is represented in an expression of a circuit using data flow analysis, the system comprising:

means for identifying a set of variables $L_p$ used in the expression;

means for conducting, for a variable within the set $L_p$, an uninitialized variable analysis for a given input signal; and means for inferring, if the variable is accessed while uninitialized, a latch for that variable.

5. The system of claim 4, further comprising means for inferring a wire if an uninitialized variable is not accessed.

6. The system of claim 4, further comprising means for determining the conditions under which the variable is modified, and from the determined conditions inferring a clocking signal for the latch.

7. A method of inferring latch elements from an HDL file using data flow analysis; the method comprising the step of:

inferring a latch if an accessed variable in an HDL expression is uninitialized for a given input signal.

8. The method of claim 7 further comprising the step of:

inferring a wire if the uninitialized variable is not accessed.

9. A method for selectively inferring latch elements in a circuit design from an HDL file; the method comprising the steps of:

modeling the file as a plurality of data flow equations;

analyzing said equations for uninitialized variables; and placing a latch at each utilized unitialized variable.

* * * * *